United States Patent
Kobayashi et al.

(10) Patent No.: US 12,040,212 B2
(45) Date of Patent: Jul. 16, 2024

(54) GLASS SUBSTRATE AND METHOD FOR MANUFACTURING GLASS SUBSTRATE

(71) Applicant: AGC Inc., Tokyo (JP)

(72) Inventors: Yuha Kobayashi, Tokyo (JP); Kenji Goto, Yamagata (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/339,476

(22) Filed: Jun. 22, 2023

(65) Prior Publication Data
US 2023/0335427 A1    Oct. 19, 2023

Related U.S. Application Data

(63) Continuation of application No. PCT/JP2021/047481, filed on Dec. 22, 2021.

(30) Foreign Application Priority Data

Dec. 23, 2020 (JP) ................. 2020-214053

(51) Int. Cl.
*B32B 3/00* (2006.01)
*C03B 5/18* (2006.01)
(Continued)

(52) U.S. Cl.
CPC ............ *H01L 21/6835* (2013.01); *C03B 5/18* (2013.01); *C03C 3/078* (2013.01); *C03C 3/083* (2013.01);
(Continued)

(58) Field of Classification Search
CPC ......... C03C 3/076; C03C 3/083; C03C 3/089; C03C 3/091; H01L 21/6835
See application file for complete search history.

(56) References Cited

U.S. PATENT DOCUMENTS 11,021,389 B2 * 6/2021 Inaba ................. H01L 21/6835
2009/0239035 A1 * 9/2009 Nagai ..................... C03C 3/087
428/141
(Continued)

FOREIGN PATENT DOCUMENTS

JP    2015-180594 A    10/2015
JP    6443668 B2    12/2018
JP    6715381 B1    7/2020

OTHER PUBLICATIONS

International Search Report issued Mar. 22, 2022 in PCT/JP2021/047481, filed on Dec. 22, 2021, 2 pages.

*Primary Examiner* — Elizabeth E Mulvaney
(74) *Attorney, Agent, or Firm* — Oblon, McClelland, Maier & Neustadt, L.L.P.

(57) ABSTRACT

To appropriately manufacture a semiconductor device. A glass substrate is a glass substrate for manufacturing the semiconductor device. In a case in which one surface is directed downward in a vertical direction, and a first position, a second position, and a third position on the one surface on an outer side in a radial direction with respect to a center point of the glass substrate are supported by supporting members, a lowest point as a position where a height in the vertical direction is the lowest on other surface is positioned in a circular central region on an inner side in the radial direction with respect to the first position, the second position, and the third position when viewed from the vertical direction, a center of the central region is a center point of the glass substrate, and a diameter of the central region has a length of ⅓ of a diameter of the glass substrate.

19 Claims, 5 Drawing Sheets

(51) Int. Cl.
*C03C 3/078* (2006.01)
*C03C 3/083* (2006.01)
*C03C 3/085* (2006.01)
*C03C 3/087* (2006.01)
*C03C 3/089* (2006.01)
*C03C 3/091* (2006.01)
*C03C 3/093* (2006.01)
*C03C 3/095* (2006.01)
*H01L 21/683* (2006.01)

(52) U.S. Cl.
CPC .............. *C03C 3/085* (2013.01); *C03C 3/087* (2013.01); *C03C 3/089* (2013.01); *C03C 3/091* (2013.01); *C03C 3/093* (2013.01); *C03C 3/095* (2013.01)

(56) References Cited

U.S. PATENT DOCUMENTS

2021/0032155 A1    2/2021  Inaba et al.
2023/0135358 A1*   5/2023  Nagano .................. C03C 3/097
                                                              501/69

\* cited by examiner

GLASS SUBSTRATE AND METHOD FOR MANUFACTURING GLASS SUBSTRATE

CROSS-REFERENCE TO RELATED APPLICATION(S)

This application is a continuation of International Application No. PCT/JP2021/047481, filed on Dec. 22, 2021 which claims the benefit of priority of the prior Japanese Patent Application No. 2020-214053, filed on Dec. 23, 2020, the entire contents of which are incorporated herein by reference.

BACKGROUND OF THE INVENTION

1. Field of the Invention

The present invention relates to a glass substrate and a method for manufacturing the glass substrate.

2. Description of the Related Art

A glass substrate may be used as a member for supporting a semiconductor device during a manufacturing process for the semiconductor device. For example, Japanese Patent No. 6443668 discloses a support substrate made of glass for a Fan Out Wafer Level Package.

However, at the time of manufacturing a semiconductor device while supporting the semiconductor device by a glass substrate, a temperature difference is caused between processes, and stress is caused in the glass substrate due to a difference in a thermal expansion coefficient between materials. Glass is deformed due to the stress, but the deformation is discontinuous in some cases. In a case in which the deformation of the glass is discontinuous, the glass substrate may be brought into contact with a facility, or disconnection may be caused in the device due to a sudden shape change, for example. In such a case, the semiconductor device cannot be appropriately manufactured in some cases. Thus, there is a demand for providing a glass substrate with which a semiconductor device can be appropriately manufactured.

SUMMARY OF THE INVENTION

The present invention has been made in view of the above problems, and an object is to provide a glass substrate and a method for manufacturing the glass substrate with which a semiconductor device can be appropriately manufactured.

To solve the problem above, a glass substrate of the present disclosure is for manufacturing a semiconductor device, wherein, in a case in which one surface is directed downward in a vertical direction and a first position, a second position, and a third position on the one surface on an outer side in a radial direction with respect to a center point of the glass substrate are supported by supporting members, a lowest point as a position where a height in the vertical direction is the lowest on other surface is positioned in a circular central region on an inner side in the radial direction with respect to the first position, the second position, and the third position when viewed from the vertical direction, a center of the central region is a center point of the glass substrate, and a diameter of the central region has a length of 1/3 of a diameter of the glass substrate.

To solve the problem above, a method for manufacturing the glass substrate is for manufacturing the glass substrate, the method comprises: melting a raw material; stirring the melted raw material under the condition that stirring is performed at a rotation speed equal to or higher than 5 rpm and equal to or lower than 20 rpm for a time equal to or longer than 12 hours and equal to or shorter than 24 hours; and cooling the stirred raw material to form the glass substrate.

According to the present invention, a semiconductor device can be appropriately manufactured.

DETAILED DESCRIPTION OF THE PREFERRED EMBODIMENTS

The following describes a preferred embodiment of the present invention in detail with reference to the attached drawings. The present invention is not limited to the embodiment, and in a case in which there are a plurality of embodiments, the embodiments may be combined with each other. Numerical values encompass rounded numerical values.

Glass Substrate

Figure 1A:
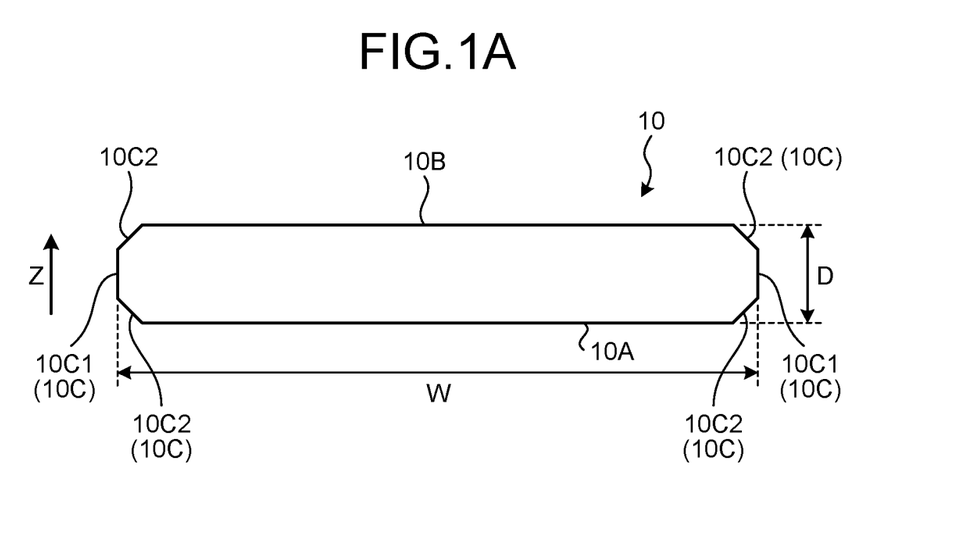
FIG. 1A is a schematic diagram of a glass substrate according to the present embodiment.
Figure 1B:
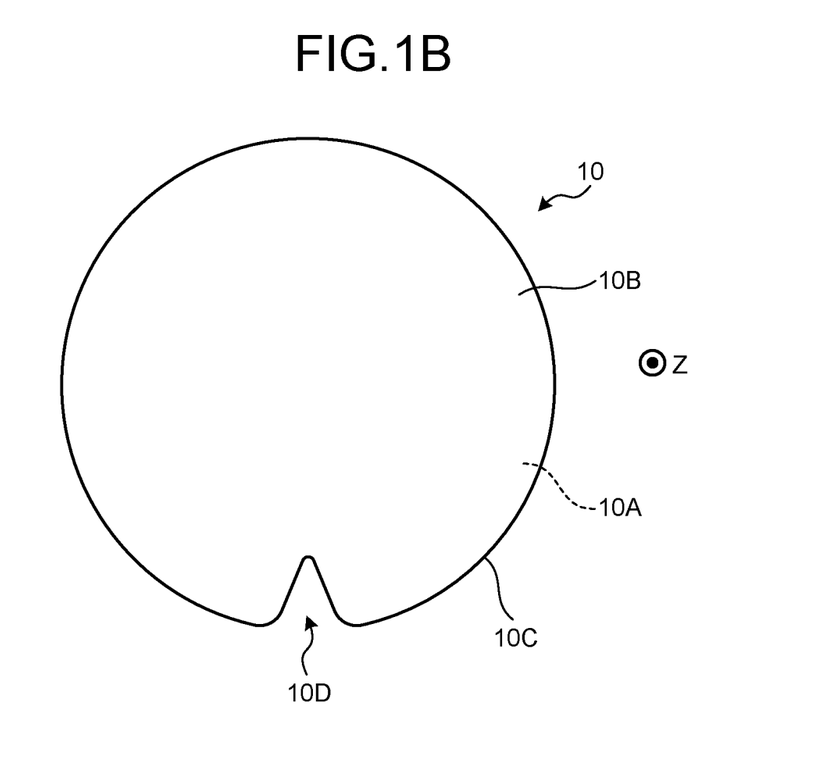
FIG. 1B is a schematic diagram of the glass substrate according to the present embodiment.

FIG. 1A and FIG. 1B are schematic diagrams of a glass substrate according to the present embodiment. FIG. 1A is a front view of a glass substrate 10 according to the present embodiment, and FIG. 1B is a plan view of the glass substrate 10 according to the present embodiment. As illustrated in FIG. 1A, the glass substrate 10 according to the present embodiment is used as a glass substrate for manufacturing a semiconductor package, and is a glass substrate that supports a semiconductor device. More specifically, the glass substrate 10 is a support glass substrate for manufacturing a Fan Out Wafer Level Package (FOWLP). For example, in a case in which the glass substrate 10 has a rectangular shape, the glass substrate 10 is a support glass substrate for manufacturing a Fan Out Panel Level Package (FOPLP). However, a use of the glass substrate 10 is not limited to supporting the semiconductor device and manufacturing the FOWLP or the FOPLP, but is optional. The glass substrate 10 may be a glass substrate used for supporting an optional member.

As illustrated in FIG. 1A and FIG. 1B, the glass substrate 10 is a plate-shaped member including a surface 10A (one surface) as a principal plane on one side and a surface 10B (other surface) as a principal plane on the opposite side of the surface 10A. As illustrated in FIG. 1B, the glass substrate 10 has a disc shape, which is a circular shape, in a plan view, that is, when viewed from a direction orthogonal to the surface 10A. In other words, the glass substrate 10 has a wafer shape. A notch part 10D (notch) may be formed on an outer peripheral surface 10C of the glass substrate 10, and the glass substrate 10 may have a shape obtained by partially notching an outer circumference of the circular shape. In this case, the notch part 10D may have a chamfered shape including an outer peripheral surface part 14C1 and an edge surface part 14C2 described later. The shape of the glass substrate 10 is not limited to the disc shape but may be an optional shape. For example, the glass substrate 10 may be a plate having a polygonal shape such as a rectangle. Hereinafter, a direction orthogonal to the surface 10A is referred to as a Z-direction. It can also be said that the Z-direction is a thickness direction of the glass substrate 10.

As illustrated in FIG. 1A, the glass substrate 10 includes chamfers formed on outer peripheral surfaces 10C. Specifically, the outer peripheral surface 10C includes an outer peripheral surface part 10C1 and edge surface parts 10C2. The outer peripheral surface part 10C1 corresponds to a portion of the outer peripheral surface 10C that is not chamfered, and the edge surface part 10C2 corresponds to a chamfered portion of the outer peripheral surface 10C. The outer peripheral surface 10C has a shape including the outer peripheral surface part 10C1 and the edge surface parts 10C2 as illustrated in FIG. 1A over the entire region in a circumferential direction of the glass substrate 10.

The outer peripheral surface part 10C1 is a surface including the most projecting portion of the outer peripheral surface 10C projecting outward in a radial direction of the glass substrate 10. As illustrated in FIG. 1A, the outer peripheral surface part 10C1 extends along the Z-direction when viewed from a direction orthogonal to the Z-direction.

The outer peripheral surface part 10C1 is connected to the surface of the glass substrate 10 via the edge surface part 10C2. That is, one end part in the Z-direction of the edge surface part 10C2 is connected to the outer peripheral surface part 10C1, and the other end part thereof is connected to the surface of the glass substrate 10. The edge surface parts 10C2 are formed on both sides of the outer peripheral surface part 10C1 in the Z-direction. That is, the outer peripheral surface 10C is formed so that one of the edge surface parts 10C2, the outer peripheral surface part 10C1, and the other one of the edge surface parts 10C2 are arranged in this order in the Z-direction. One end part in the Z-direction of the one edge surface part 10C2 is connected to the surface 10A of the glass substrate 10, and the other end part thereof is connected to the outer peripheral surface part 10C1. One end part in the Z-direction of the other edge surface part 10C2 is connected to the outer peripheral surface part 10C1, and the other end part thereof is connected to the surface 10B of the glass substrate 10.

Figure 3A:
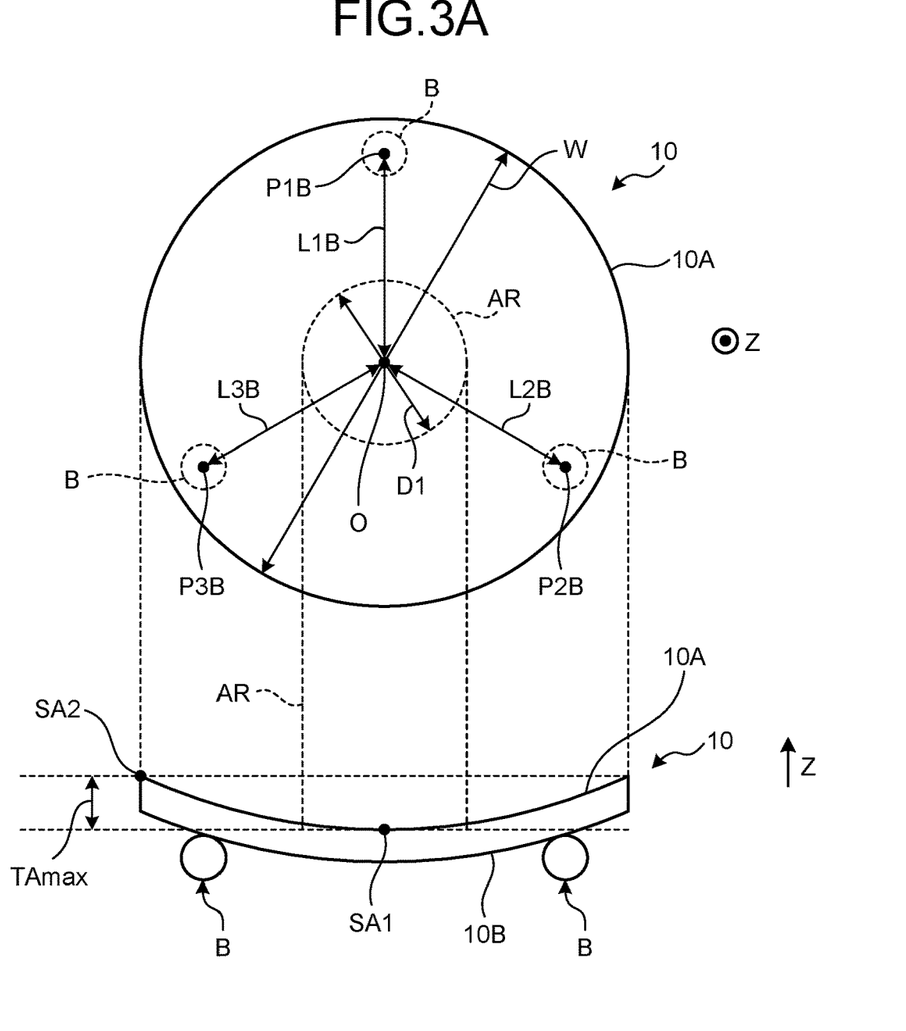
FIG. 3A is a schematic diagram for explaining deflection of the glass substrate according to the present embodiment.

As illustrated in FIG. 3, the edge surface part 10C2 is inclined with respect to the Z-direction when viewed from the direction orthogonal to the Z-direction. The edge surface part 10C2 is inclined inward in the radial direction of the glass substrate 10 as being closer to the surface side of the glass substrate 10 from the outer peripheral surface part 10C1.

As described above, the outer peripheral surface 10C has a shape including chamfers formed thereon including the outer peripheral surface part 10C1 and the edge surface parts 10C2. However, the shape of the outer peripheral surface 10C is not limited thereto, for example, the chamfers are not necessarily formed thereon.

Diameter of Glass Substrate

A diameter W of the glass substrate 10 is preferably equal to or larger than 150 mm and equal to or smaller than 700 mm, more preferably equal to or larger than 150 mm and equal to or smaller than 450 mm, even more preferably equal to or larger than 150 mm and equal to or smaller than 400 mm, yet more preferably equal to or larger than 250 mm and equal to or smaller than 350 mm, and further more preferably equal to or larger than 300 mm and equal to or smaller than 350 mm. By causing the diameter W to fall within this range, a member such as a semiconductor device can be appropriately supported. The diameter W is a diameter in a case in which the glass substrate 10 has a circular shape. However, in a case in which the glass substrate 10 does not have the circular shape, the diameter W may indicate a maximum value of a distance between optional two points on an outer peripheral edge of the glass substrate 10.

Thickness of Glass Substrate

A thickness D of the glass substrate 10, that is, a length between the surface 10A and the surface 10B, is preferably equal to or smaller than 2 mm, more preferably equal to or larger than 0.5 mm and equal to or smaller than 2.0 mm, even more preferably equal to or larger than 0.6 mm and equal to or smaller than 1.5 mm, and yet more preferably equal to or larger than 0.6 mm and equal to or smaller than 1.0 mm. By causing the thickness D to fall within this range, increase in weight of the glass substrate 10 due to a large thickness is suppressed, so that the glass substrate 10 is preferable for manufacturing the semiconductor device. On the other hand, in a case in which the thickness D falls within this range, the possibility that the semiconductor device cannot be appropriately manufactured becomes high due to influence of deflection. However, as described later, by causing a position of the lowest point due to self weight deflection to be closer to a center side, deterioration of manufacturability of the semiconductor device can be suppressed.

A deviation of the thickness D is preferably equal to or smaller than 10 μm, and more preferably equal to or smaller than 3 μm. By causing the deviation of the thickness D to fall within this range, the thickness D of the glass substrate 10 becomes almost uniform, and the semiconductor device can be appropriately manufactured. The deviation of the thickness D indicates a deviation of the thickness D for each position (each pair of coordinates) on a plane along the surface of the glass substrate 10. For example, the thickness D at the position may be calculated for each position (each pair of coordinates) on the plane along the surface of the glass substrate 10, and a difference between a maximum value and a minimum value of thicknesses D at respective positions may be caused to be the deviation of the thickness D.

Young's Modulus of Glass Substrate

A Young's modulus of the glass substrate 10 is preferably equal to or larger than 60 GPa and equal to or smaller than 150 GPa, more preferably equal to or larger than 70 GPa and equal to or smaller than 120 GPa, and even more preferably equal to or larger than 75 GPa and equal to or smaller than 100 GPa. By causing the Young's modulus to fall within this range, rigidity of the glass substrate can be prevented from being lowered, and a shape change of the glass substrate can be suppressed, so that deterioration of manufacturability of the semiconductor device can be suppressed. Herein, the Young's modulus of the glass substrate 10 may be a value that is measured based on propagation of ultrasonic waves using 38DL PLUS manufactured by Olympus Corporation.

Density of Glass Substrate

Density of the glass substrate 10 is preferably equal to or higher than 2.0 g/cm$^3$ and equal to or lower than 4.0 g/cm$^3$, and more preferably equal to or higher than 2.5 g/cm$^3$ and equal to or lower than 3.3 g/cm$^3$. By causing the density to fall within this range, increase in the weight of the glass substrate 10 can be suppressed, and deterioration of the manufacturability of the semiconductor device can be suppressed. The density of the glass substrate 10 may be a value measured by using the Archimedes method.

Composition of Glass Substrate

The glass substrate 10 preferably contains the following compounds in mass % on an oxide basis. By causing the glass substrate 10 to have the following composition, members can be appropriately supported.

$SiO_2$: preferably equal to or larger than 40 mass % and equal to or smaller than 75 mass %, and more preferably equal to or larger than 50 mass % and equal to or smaller than 75 mass %.

$Al_2O_3$: preferably equal to or larger than 0 mass % and equal to or smaller than 20 mass %, and more preferably equal to or larger than 0 mass % and equal to or smaller than 15 mass %.

$B_2O_3$: preferably equal to or larger than 0 mass % and equal to or smaller than 20 mass %, and more preferably equal to or larger than 0 mass % and equal to or smaller than 10 mass %.

MgO: preferably equal to or larger than 0 mass % and equal to or smaller than 25 mass %.

CaO: preferably equal to or larger than 0 mass % and equal to or smaller than 25 mass %, and more preferably equal to or larger than 0 mass % and equal to or smaller than 15 mass %.

SrO: preferably equal to or larger than 0 mass % and equal to or smaller than 10 mass %.

BaO: preferably equal to or larger than 0 mass % and equal to or smaller than 20 mass %, and more preferably equal to or larger than 0 mass % and equal to or smaller than 15 mass %.

$Li_2O$: preferably equal to or larger than 0 mass % and equal to or smaller than 40 mass %.

$Na_2O$: preferably equal to or larger than 0 mass % and equal to or smaller than 15 mass %.

$K_2O$: preferably equal to or larger than 0 mass % and equal to or smaller than 10 mass %.

$ZrO_2$: preferably equal to or larger than 0 mass % and equal to or smaller than 10 mass %, more preferably equal to or larger than 0 mass % and equal to or smaller than 8 mass %, and even more preferably equal to or larger than 0 mass % and equal to or smaller than 5 mass %.

$TiO_2$: preferably equal to or larger than 0 mass % and equal to or smaller than 5 mass %.

$Y_2O_3$: preferably equal to or larger than 0 mass % and equal to or smaller than 10 mass %.

Deflection of Glass Substrate

Figure 2A:
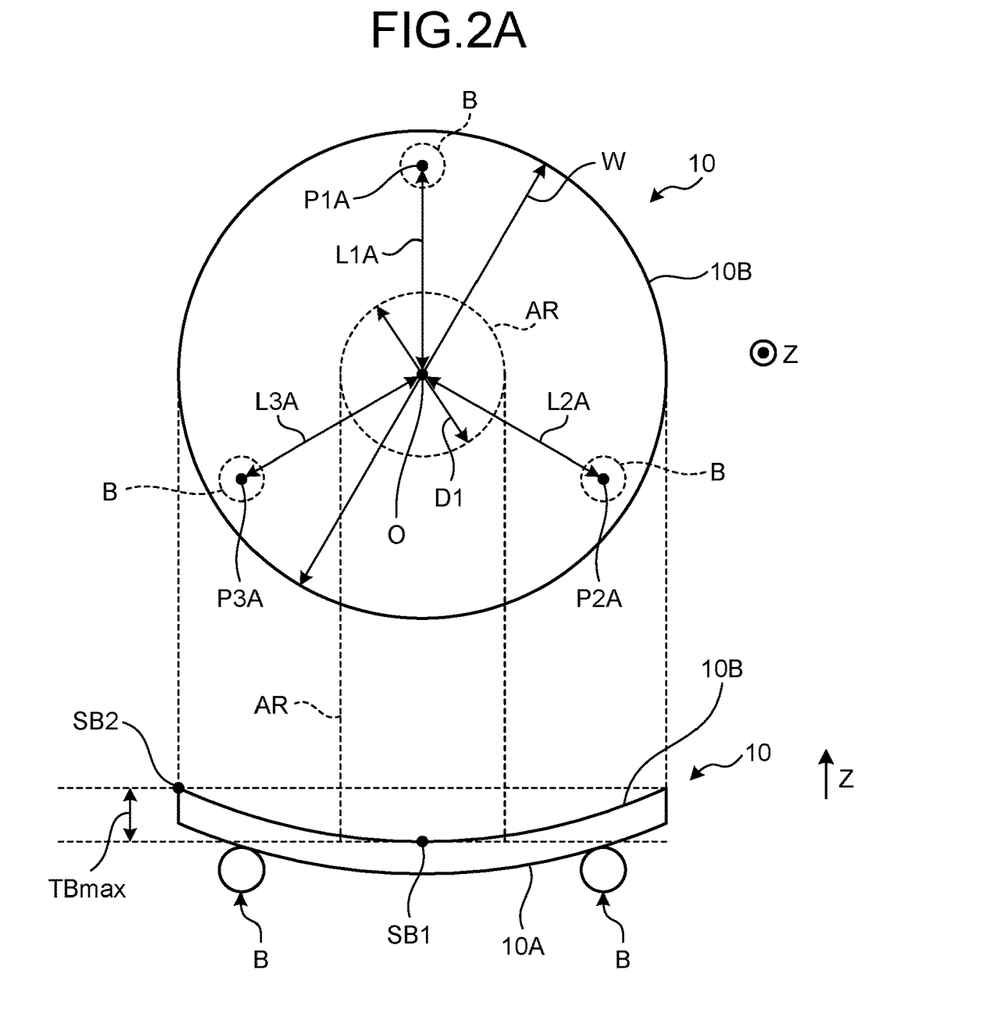
FIG. 2A is a schematic diagram for explaining deflection of the glass substrate according to the present embodiment.
Figure 2B:
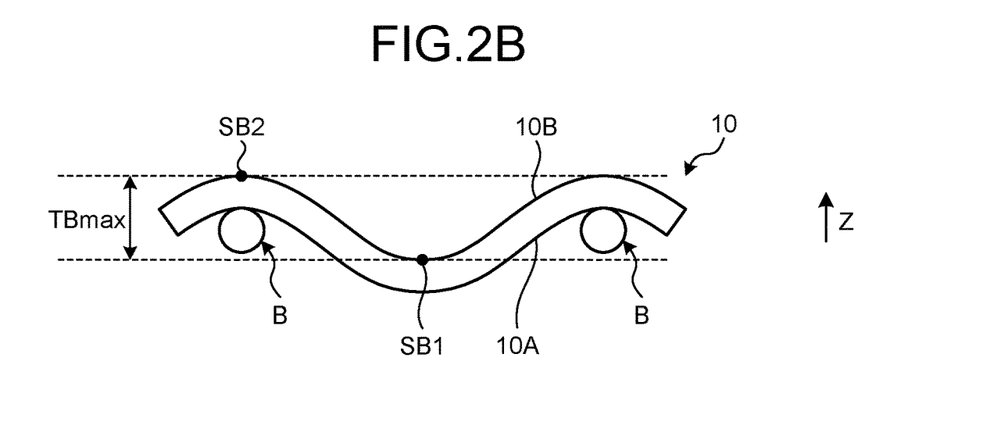
FIG. 2B is a schematic diagram for explaining deflection of the glass substrate according to the present embodiment.

FIG. 2A and FIG. 2B are schematic diagrams for explaining deflection of the glass substrate according to the present embodiment. FIG. 2A is a diagram for explaining an example of deflection due to self weight in a case of supporting, by supporting members B, three points including a first position P1A, a second position P2A, and a third position P3A on an outer side in the radial direction with respect to a center point O of the glass substrate 10 when viewed from the Z-direction. The first position P1A is a position on the surface 10A that is distant from a center point O of the glass substrate 10 by a distance L1A toward an outer side in the radial direction. The second position P2A is a position on the surface 10A that is distant from the center point O of the glass substrate 10 by a distance L2A toward the outer side in the radial direction, and is a position shifted from the first position P1A by 120 degrees in the circumferential direction assuming that the center point O is the center. The third position P3A is a position on the surface 10A that is distant from the center point O of the glass substrate 10 by a distance L3A toward the outer side in the radial direction, and is a position shifted from the first position P1A and the second position P2A by 120 degrees in the circumferential direction assuming that the center point O is the center. The radial direction herein means a radial direction assuming that the center point O is the center. The distance L1A, the distance L2A, and the distance L3A are the same lengths, and each of them has a length of $^{29}\!/_{30}$ times a half of the diameter W (radius) of the glass substrate 10. The supporting member B may be a spherical-shaped member having a diameter equal to or larger than 1 mm and equal to or smaller than 2 mm, and the diameter is more preferably 1.6 mm. Material of the supporting member B is preferably material that is softer than glass and is hardly deformed due to temperature, humidity, or glass weight during measurement. For example, the material is resin such as Polyetheretherketone (PEEK) and Polytetrafluoroethylene (PTFE), and the PEEK may be used herein.

As illustrated in FIG. 2A, in a case in which the surface 10A of the glass substrate 10 is directed downward in a vertical direction, and the first position P1A, the second position P2A, and the third position P3A on the surface 10A are supported by the supporting members B, a position where the height in the vertical direction is the lowest on the surface 10B on an upper side in the vertical direction is assumed to be a lowest point SB1. That is, it can be said that the lowest point SB1 is a position where a deflection amount becomes the largest on the surface 10B. In this case, the lowest point SB1 is positioned in a central region AR when viewed from the vertical direction (Z-direction). The central region AR is a region on an inner side in the radial direction with respect to the first position P1A, the second position P2A, and the third position P3A. More specifically, the central region AR is a circular region the center of which is the center point O and a diameter D1 of which has a length of ⅓ of the diameter W of the glass substrate 10.

In this way, in a case in which the surface 10A of the glass substrate 10 is directed downward in the vertical direction and the three points including the first position P1A, the second position P2A, and the third position P3A on the surface 10A are supported by the supporting members B, the lowest point SB is positioned in the central region AR. Regarding the glass substrate 10, the lowest point SB is positioned in the central region AR instead of the outside of the central region AR, so that deformation such that a deflected position of the glass substrate 10 is shifted is suppressed at the time of manufacturing the semiconductor device, for example, and deterioration of the manufacturability of the semiconductor device can be suppressed.

In a case in which the surface 10A of the glass substrate 10 is directed downward in the vertical direction and the first position P1A, the second position P2A, and the third position P3A on the surface 10A are supported by the supporting members B, a maximum deflection amount of the glass substrate 10 is assumed to be a maximum deflection amount TBmax. It can be said that the maximum deflection amount TBmax is a maximum deflection amount due to self weight of the glass substrate 10, and is a distance along the vertical direction from a highest point SB2 of the glass substrate 10 to the lowest point SB1. The highest point SB2 is a position at which the height in the vertical direction is the highest on the surface 10B on an upper side in the vertical direction in a case in which the surface 10A of the glass substrate 10 is directed downward in the vertical direction and the first position P1A, the second position P2A, and the third position P3A on the surface 10A are supported by the supporting members B. In this case, in a case in which the diameter W of the glass substrate 10 is equal to or larger than 150 mm and equal to or smaller than 700 mm, and the thickness D thereof is equal to or smaller than 2 mm, the maximum deflection amount TBmax is preferably equal to or smaller than 650 µm, more preferably equal to or larger than 10 µm and equal to or smaller than 630 µm, and even more preferably equal to or larger than 50 µm and equal to or smaller than 625 µm. By causing the maximum deflection amount TBmax to fall within this range, the deflection amount can be suppressed, so that deterioration of the manufacturability of the semiconductor device can be suppressed more preferably. The maximum deflection amount TBmax can be measured by Dyvoce manufactured by Kohzu Precision Co., Ltd.

FIG. 2A illustrates an example of a case in which the glass substrate 10 is simply warped, but warpage of the glass substrate 10 is not limited to simple warpage as illustrated in FIG. 2A. For example, the glass substrate 10 may be warped as illustrated in FIG. 2B. That is, although the glass substrate 10 is deflected to have a concave shape concaved from an outer peripheral end toward the lowest point SB1 in FIG. 2A, the glass substrate 10 may be deflected to be concaved from a point supported by the supporting member B toward the lowest point SB1 and also concaved from a point supported by the supporting member B toward the outer peripheral end as illustrated in FIG. 2B.

Figure 3B:
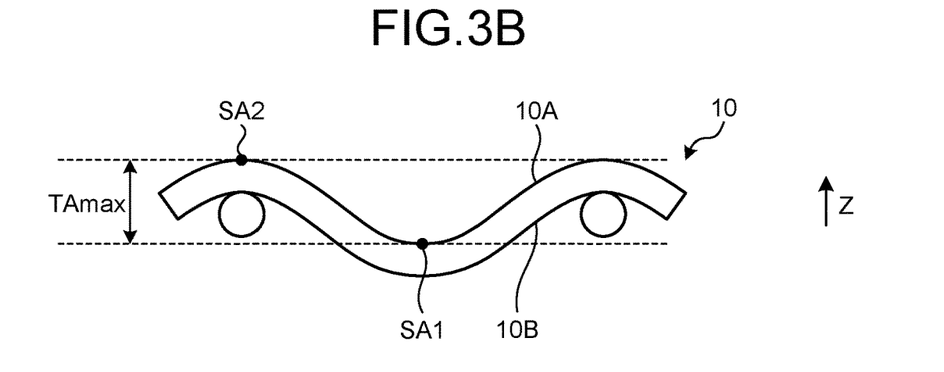
FIG. 3B is a schematic diagram for explaining deflection of the glass substrate according to the present embodiment.

In the above description, described is deflection of the glass substrate 10 in a case in which the surface 10A is directed downward in the vertical direction. The following describes deflection of the glass substrate 10 in a case in which the surface 10B is directed downward in the vertical direction. FIG. 3A and FIG. 3B are schematic diagrams for explaining deflection of the glass substrate according to the present embodiment. FIG. 3A is a diagram for explaining an example of deflection due to self weight in a case of supporting, by supporting members B, three points including a first position P1B, a second position P2B, and a third position P3B on an outer side in the radial direction with respect to a center point O of the glass substrate 10 when viewed from the Z-direction. The first position P1B is a position on the surface 10B that is distant from the center point O of the glass substrate 10 by a distance L1B toward an outer side in the radial direction. The second position P2B is a position on the surface 10B that is distant from the center point O of the glass substrate 10 by a distance L2B toward the outer side in the radial direction, and is a position shifted from the first position P1B by 120 degrees in the circumferential direction assuming that the center point O is the center. The third position P3B is a position on the surface 10B that is distant from the center point O of the glass substrate 10 by a distance L3B toward the outer side in the radial direction, and is a position shifted from the first position P1B and the second position P2B by 120 degrees in the circumferential direction assuming that the center point O is the center. The distance L1B, the distance L2B, and the distance L3B are the same lengths, and each of them has a length of $29/30$ times a half of the diameter W (radius) of the glass substrate 10.

As illustrated in FIG. 3A, in a case in which the surface 10B of the glass substrate 10 is directed downward in the vertical direction and the first position P1B, the second position P2B, and the third position P3B on the surface 10B are supported by the supporting members B, a position where the height in the vertical direction is the lowest on the surface 10A on an upper side in the vertical direction is assumed to be a lowest point SA1. That is, it can be said that the lowest point SA1 is a position where the deflection amount becomes the largest on the surface 10A. In this case, it is preferable that the lowest point SA1 is positioned in the central region AR when viewed from the vertical direction (Z-direction).

FIG. 3A illustrates an example of a case in which the glass substrate 10 is simply warped, but warpage of the glass substrate 10 is not limited to simple warpage as illustrated in FIG. 3A. For example, the glass substrate 10 may be warped as illustrated in FIG. 3B. That is, although the glass substrate 10 is deflected to have a concave shape concaved from the outer peripheral end toward the lowest point SA1 in FIG. 3A, the glass substrate 10 may be deflected to be concaved from a point supported by the supporting member B toward the lowest point SA1 and also concaved from a point supported by the supporting member B toward the outer peripheral end as illustrated in FIG. 3B.

In this way, regarding the glass substrate 10, the lowest point SB1 (refer to FIG. 2A) in a case in which the surface 10A is directed downward in the vertical direction and supported at three points and the lowest point SA1 (refer to FIG. 3A) in a case in which the surface 10B is directed downward in the vertical direction and supported at three points are both positioned in the central region AR. However, it is sufficient that at least one of the lowest points SB1 and SA1 of the glass substrate 10 is positioned in the central region AR. For example, one of the lowest points SB1 and SA1 may be positioned outside the central region AR.

In a case in which the surface 10B of the glass substrate 10 is directed downward in the vertical direction and the first position P1B, the second position P2B, and the third position P3B on the surface 10B are supported by the supporting members B, a maximum deflection amount of the glass substrate 10 is assumed to be a maximum deflection amount TAmax. It can be said that the maximum deflection amount TAmax is a maximum deflection amount due to self weight of the glass substrate 10, and is a distance along the vertical direction from a highest point SA2 of the glass substrate 10 to the lowest point SA1. The highest point SA2 is a position at which the height in the vertical direction is the highest on the surface 10A on an upper side in the vertical direction in a case in which the surface 10B of the glass substrate 10 is directed downward in the vertical direction and the first position P1B, the second position P2B, and the third position P3B on the surface 10B are supported by the supporting members B. In this case, in a case in which the diameter W of the glass substrate 10 is equal to or larger than 150 mm and equal to or smaller than 700 mm, and the thickness D thereof is equal to or smaller than 2 mm, the maximum deflection amount TAmax is preferably equal to or smaller than 650 µm, more preferably equal to or larger than 10 µm and equal to or smaller than 630 µm, and even more preferably equal to or larger than 50 µm and equal to or smaller than 625 µm. By causing the maximum deflection amount TAmax to fall within this range, the deflection amount can be suppressed, so that deterioration of the manufacturability of the semiconductor device can be suppressed more preferably. The maximum deflection amount TAmax can be measured by Dyvoce manufactured by Kohzu Precision Co., Ltd.

A larger value of the maximum deflection amount TBmax in a case in which the surface 10A is directed downward in the vertical direction and the maximum deflection amount TAmax in a case in which the surface 10B is directed downward in the vertical direction is assumed to be a maximum deflection amount Tmax. In this case, a value obtained by multiplying the maximum deflection amount Tmax by a cube of the thickness D of the glass substrate 10 and a Young's modulus E of the glass substrate 10 to be divided by 1000 (that is, Tmax·$D^3$·E/1000) is preferably equal to or smaller than 20. By causing Tmax·$D^3$·E/1000 to fall within this range, it is possible to more preferably suppress deformation such that a deflected position of the glass substrate 10 is shifted.

Warpage Amount of Glass Substrate

Herein, a warpage amount of the glass substrate 10 excepting deflection due to self weight is assumed to be a warpage amount ΔT. In this case, the warpage amount ΔT is preferably equal to or smaller than 250 μm, and more preferably equal to or smaller than 100 μm. By causing the warpage amount ΔT to fall within this range, warpage of the semiconductor device manufactured on the glass substrate 10 can be suppressed, and deterioration of the manufacturability of the semiconductor device can be suppressed more preferably. The warpage amount ΔT is a value obtained by dividing, by 2, a maximum value of differences in the deflection amounts at respective positions (respective coordinates) on a plane along the surface of the glass substrate 10 between the case in which the surface 10B is directed downward in the vertical direction and supported by the supporting members B as described above and the case in which the surface 10A is directed downward in the vertical direction and supported by the supporting members B as described above. That is, $TA_{(i)}$ is assumed to be a deflection amount at a position (coordinates) i on a plane along the surface of the glass substrate 10 in a case in which the surface 10B is directed downward in the vertical direction and supported by the supporting members B as described above, and $TB_{(i)}$ is assumed to be a deflection amount at the position (coordinates) i on the plane along the surface of the glass substrate 10 in a case in which the surface 10A is directed downward in the vertical direction and supported by the supporting members B as described above. The largest value among differences between the deflection amount $TA_{(i)}$ and the deflection amount $TB_{(i)}$ at respective positions i is assumed to be $MAX(TA_{(i)}-TB_{(i)})$. In this case, the warpage amount ΔT can be obtained by the following expression (1). That is, the warpage amount ΔT is a value obtained by dividing an absolute value of $MAX(TA_{(i)}-TB_{(i)})$ by 2.

$$\Delta T = |MAX(TA_{(i)} - TB_{(i)})|/2 \quad (1)$$

Method for Manufacturing Glass Substrate

Figure 4:
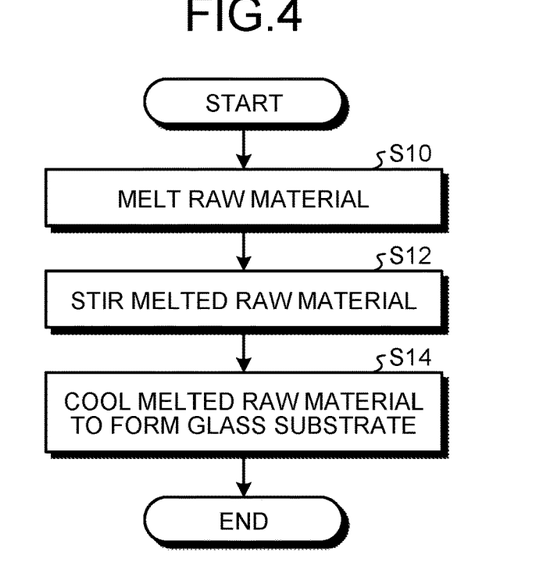
FIG. 4 is a flowchart for explaining a manufacturing method for the glass substrate according to the present embodiment.

Next, the following describes a method for manufacturing the glass substrate 10. FIG. 4 is a flowchart for explaining the manufacturing method for the glass substrate according to the present embodiment. As illustrated in FIG. 4, in the manufacturing method according to the present embodiment, a raw material adjusted to the composition of the glass substrate 10 is heated to be melted (Step S10). The melted raw material is then stirred (Step S12). A stirring condition for the raw material is optional. For example, it is preferable that a rotation speed of a stirring blade for stirring the melted raw material is set to be equal to or higher than 5 rpm and equal to or lower than 20 rpm, and stirring is performed for a time equal to or longer than 12 hours and equal to or shorter than 24 hours. The stirring blade is a member for stirring the melted raw material, and has an optional shape. For example, the stirring blade does not necessarily have a blade shape. In the present manufacturing method, the glass substrate 10 can be manufactured without stirring the melted raw material as described above, but it is preferable to stir the melted raw material as described above because an anomaly may be prevented from occurring in a deflection shape.

Thereafter, the melted raw material is cooled to form the glass substrate 10 (Step S14). A step of forming the glass substrate 10 may be performed by using an optional method. For example, after manufacturing an ingot of glass, the glass substrate 10 may be formed by cutting out the ingot. In this case, for example, the ingot may be manufactured by using a melting and casting method. Alternatively, for example, the glass substrate 10 having a plate shape may be directly formed without manufacturing the ingot of glass. In this case, for example, the plate-shaped glass substrate 10 may be manufactured by using a roll-out process, a down-draw process, a fusion process, a float process, and the like. In either method, a process of polishing a glass surface may be added.

Effects

As described above, the glass substrate 10 according to the present embodiment is used for manufacturing the semiconductor device, and in a case in which the one surface 10A is directed downward in the vertical direction and the first position P1A, the second position P2A, and the third position P3A on the one surface 10A on an outer side in the radial direction with respect to the center point O of the glass substrate 10 are supported by the supporting members B, the lowest point SB1 as a position where the height in the vertical direction is the lowest on the other surface 10B is positioned in the central region AR when viewed from the vertical direction. The central region AR is a circular region on an inner side in the radial direction with respect to the first position P1A, the second position P2A, and the third position P3A, the center of which is the center point O of the glass substrate 10, and the diameter D1 of which has a length of ⅓ of the diameter W of the glass substrate 10. Herein, at the time of manufacturing the semiconductor device while supporting it by the glass substrate, a temperature difference may be caused between processes, and stress may be caused in the glass substrate due to a difference in a thermal expansion coefficient between materials. The glass substrate is deformed due to the stress, but the deformation is discontinuous in some cases. In a case in which the deformation of the glass substrate is discontinuous, the glass substrate may be brought into contact with a facility, or disconnection may be caused in the device due to a sudden shape change, for example. In such a case, the semiconductor device cannot be appropriately manufactured in some cases. On the other hand, regarding the glass substrate 10 according to the present embodiment, the lowest point SB1 at which self weight deflection becomes the largest is positioned in the central region AR, so that it is possible to suppress discontinuous deformation such that a deflected position of the glass substrate 10 is shifted due to a load at the time of supporting the semiconductor device. Thus, with the glass substrate 10 according to the present embodiment, deterioration of the manufacturability of the semiconductor device can be suppressed, and the semiconductor device can be appropriately manufactured.

Regarding the glass substrate 10, in a case in which the other surface 10B is directed downward in the vertical direction and the first position P1B, the second position P2B, and the third position P3B on the other surface 10B on an outer side in the radial direction with respect to the center point O of the glass substrate 10 are supported by the supporting members B, the lowest point SA1 as a position where the height in the vertical direction is the lowest on the one surface 10A is preferably positioned in the central region AR when viewed from the vertical direction. Regarding the glass substrate 10 according to the present embodiment, the lowest points SA1 and SB1 where self weight deflection becomes maximum are positioned in the central region AR even when either of the surfaces 10A and 10B is directed downward. Thus, with the glass substrate 10, it is possible to further suppress deformation such that a deflected position of the glass substrate 10 is shifted, and the semiconductor device can be manufactured more preferably.

Regarding the glass substrate 10, the thickness D is preferably equal to or smaller than 2 mm. By causing the thickness D to fall within this range, increase in weight of the glass substrate 10 can be suppressed. When the thickness D is caused to be small as described above, there is a concern about deterioration of the manufacturability of the semiconductor device due to influence of deflection. However, with the glass substrate 10, by causing the lowest point SB1 to be positioned in the central region AR, it is possible to suppress deformation such that a deflected position of the glass substrate 10 is shifted, and suppress deterioration of the manufacturability of the semiconductor device.

The diameter W of the glass substrate 10 is equal to or larger than 150 mm and equal to or smaller than 700 mm, and in a case in which the one surface 10A is directed downward in the vertical direction and the first position P1A, the second position P2A, and the third position P3A on the one surface 10A are supported by the supporting members B, the maximum deflection amount TBmax is preferably equal to or smaller than 650 μm. By causing the maximum deflection amount of the glass substrate 10 to fall within this range, deflection can be prevented from being too large, so that the semiconductor device can be manufactured more preferably.

In a case in which a larger value of the maximum deflection amount TBmax and the maximum deflection amount TAmax is assumed to be Tmax, the maximum deflection amount TBmax in a case in which the one surface 10A of the glass substrate 10 is directed downward in the vertical direction and the first position P1A, the second position P2A, and the third position P3A on the one surface 10A are supported by the supporting members B, and the maximum deflection amount TAmax in a case in which the other surface 10B is directed downward in the vertical direction and the first position P1B, the second position P2B, and the third position P3B on the other surface 10B are supported by the supporting members B, the thickness of the glass substrate 10 is assumed to be D, and the Young's modulus of the glass substrate 10 is assumed to be E, $Tmax \cdot D^3 \cdot E/1000 \leq 20$ is preferably satisfied. By causing $Tmax \cdot D^3 \cdot E/1000$ to fall within this range, it is possible to more preferably suppress deformation such that a deflected position of the glass substrate 10 is shifted.

In a case in which the other surface 10B of the glass substrate 10 is directed downward in the vertical direction, and the first position P1B, the second position P2B, and the third position P3B on the other surface 10B are supported by the supporting members B, and in a case in which the diameter W of the glass substrate 10 is equal to or larger than 150 mm and equal to or smaller than 700 mm, and the thickness D is equal to or smaller than 2 mm, the maximum deflection amount TAmax is preferably equal to or smaller than 650 μm. By causing the maximum deflection amount of the glass substrate 10 to fall within this range, deflection can be prevented from being too large, so that the semiconductor device can be manufactured more preferably.

A portion of the glass substrate 10 between the surface and the outer peripheral surface 10C (the edge surface part 14C2) is preferably chamfered. As the glass substrate 10 is chamfered, the semiconductor device can be manufactured more preferably.

The notch part 10D is preferably formed on the outer peripheral surface 10C of the glass substrate 10. The notch part 10D is formed on the glass substrate 10, so that positioning and the like can be appropriately performed, and the semiconductor device can be manufactured more preferably.

Regarding the glass substrate 10, it is preferable that the warpage amount ΔT excepting deflection due to self weight is equal to or smaller than 250 μm, and deviation of the thickness D is equal to or smaller than 10 μm. Regarding the glass substrate 10, by causing the warpage amount ΔT and the deviation of the thickness D to fall within this range, deformation such that a deflected position of the glass substrate 10 is shifted can be suppressed, and deterioration of the manufacturability of the semiconductor device can be suppressed.

Regarding the glass substrate 10, it is preferable that the warpage amount ΔT excepting deflection due to self weight is equal to or smaller than 100 μm, and deviation of the thickness D is equal to or smaller than 3 μm. Regarding the glass substrate 10, by causing the warpage amount ΔT and the deviation of the thickness D to fall within this range, deformation such that a deflected position of the glass substrate 10 is shifted can be suppressed, and deterioration of the manufacturability of the semiconductor device can be suppressed.

The glass substrate 10 preferably contains, in mass % on an oxide basis,
$SiO_2$: equal to or larger than 40 mass % and equal to or smaller than 75 mass %,
$Al_2O_3$: equal to or larger than 0 mass % and equal to or smaller than 20 mass %,
$B_2O_3$: equal to or larger than 0 mass % and equal to or smaller than 20 mass %,
MgO: equal to or larger than 0 mass % and equal to or smaller than 25 mass %,
CaO: equal to or larger than 0 mass % and equal to or smaller than 25 mass %,
SrO: equal to or larger than 0 mass % and equal to or smaller than 10 mass %,
BaO: equal to or larger than 0 mass % and equal to or smaller than 20 mass %,
$Li_2O$: equal to or larger than 0 mass % and equal to or smaller than 40 mass %,
$Na_2O$: equal to or larger than 0 mass % and equal to or smaller than 15 mass %,
$K_2O$: equal to or larger than 0 mass % and equal to or smaller than 10 mass %,
$ZrO_2$: equal to or larger than 0 mass % and equal to or smaller than 10 mass %,
$TiO_2$: equal to or larger than 0 mass % and equal to or smaller than 5 mass %, and
$Y_2O_3$: equal to or larger than 0 mass % and equal to or smaller than 10 mass %. By causing the composition to fall within this range, the semiconductor device can be manufactured more preferably.

The glass substrate 10 is preferably a glass substrate for manufacturing at least one of the Fan Out Wafer Level Package and the Fan Out Panel Level Package. The glass substrate 10 is suitable for a use of the Fan Out Wafer Level Package and the Fan Out Panel Level Package.

The method for manufacturing the glass substrate 10 according to the present embodiment includes a step of melting the raw material, a step of stirring the melted raw material under the condition that stirring is performed at the rotation speed equal to or higher than 5 rpm and equal to or lower than 20 rpm for a time equal to or longer than 12 hours and equal to or shorter than 24 hours, and a step of cooling the stirred raw material to form the glass substrate 10. According to the present manufacturing method, the raw material can be caused to be uniform by stirring the melted raw material, deformation such that a deflected position of the glass substrate 10 is shifted can be suppressed, and it is possible to provide the glass substrate 10 with which the semiconductor device can be preferably manufactured.

EXAMPLES

Next, the following describes examples. An implementation aspect may be changed so long as an effect of the invention is exhibited.

Table 1 indicates glass substrates in the respective examples. In this example, the glass substrate was manufactured by adjusting the raw material so that the glass substrate had predetermined composition. A Young's modulus, density, a position of the lowest point due to self weight deflection, and a deflection amount were measured for the manufactured glass substrate. The Young's modulus was measured by using 38DL PLUS manufactured by Olympus Corporation, and the density was measured by using the Archimedes method.

In measurement of the position of the lowest point and measurement of the deflection amount, a second surface as the other surface of the glass substrate was directed downward in the vertical direction, and the first position P1A, the second position P2A, and the third position P3A described in the present embodiment on a first surface as the one surface of the glass substrate were supported by the supporting members B. In this case, the position of the lowest point where the height in the vertical direction was the lowest on the first surface was measured, and a measurement result was indicated as "on first surface" of "position of lowest point" in Table 1. In Table 1, the position of the lowest point is indicated as "inside" in a case in which the position of the lowest point is present in the central region AR described in the present embodiment, and the position of the lowest point is indicated as "outside" in a case in which the position of the lowest point is not present in the central region AR described in the present embodiment (present outside the central region AR). Regarding the deflection amount, deflection amounts at respective positions on the first surface in a case of supporting the glass substrate as described above were measured, and the minimum value to the maximum value thereof were assumed to be "deflection on first surface" in Table 1. The deflection amount was measured by using Dyvoce manufactured by Kohzu Precision Co., Ltd.

The first surface as the one surface was directed downward in the vertical direction, and the first position P1B, the second position P2B, and the third position P3B described in the present embodiment on the second surface as the other surface were supported by the supporting members B. In this case, the position of the lowest point where the height in the vertical direction was the lowest on the second surface was measured, and a measurement result was indicated as "on second surface" of "position of lowest point" in Table 1. In Table 1, the position of the lowest point is indicated as "inside" in a case in which the position of the lowest point is present in the central region AR described in the present embodiment, and the position of the lowest point is indicated as "outside" in a case in which the position of the lowest point is not present in the central region AR described in the present embodiment (present outside the central region AR). Regarding the deflection amount, deflection amounts at respective positions on the second surface in a case of supporting the glass substrate as described above were measured, and the minimum value to the maximum value thereof were assumed to be "deflection on second surface" in Table 1.

In Table 1, "maximum deflection amount" is a maximum value of "deflection on first surface" and "deflection on second surface", and the warpage amount is a value calculated as indicated by the expression (1) described above.

In Table 1, "Tmax·D³·E/1000" is a value obtained by multiplying the maximum deflection amount by the cube of the "thickness" and the "Young's modulus" to be divided by 1000.

TABLE 1

| No. | Composition | Stirring | Diameter (mm) | Thickness (mm) | Young's modulus (GPa) | Density (g/cm³) | Position of lowest point On first surface | Position of lowest point On second surface | Deflection on first surface (μm) | Deflection on second surface (μm) | Maximum deflection (μm) | Warpage amount (μm) | Tmax·D³·E/1000 | Evaluation |
|---|---|---|---|---|---|---|---|---|---|---|---|---|---|---|
| Example 1 | C1 | Performed | φ300 | 0.6 | 75.8 | 2.77 | Outside | Inside | 523-618 | 502-598 | 618 | 23-35 | 10.1 | ○ |
| Example 2 | C1 | Performed | φ300 | 0.7 | 75.8 | 2.77 | Inside | Inside | 390-426 | 316-357 | 426 | 49-57 | 11.1 | ○ |
| Example 3 | C1 | Performed | φ300 | 0.85 | 75.8 | 2.77 | Outside | Inside | 268-289 | 223-252 | 289 | 29-45 | 13.5 | ○ |
| Example 4 | C1 | Performed | φ300 | 1.0 | 75.8 | 2.77 | Outside | Inside | 240-258 | 193-204 | 258 | 67-70 | 19.6 | ○ |
| Example 5 | C2 | Performed | φ300 | 0.7 | 73.6 | 2.38 | Outside | Inside | 281-470 | 423-526 | 526 | 103-240 | 13.3 | ○ |
| Example 6 | C3 | Performed | φ300 | 0.7 | 72.9 | 2.5 | Inside | Inside | 382-402 | 331-351 | 402 | 29-46 | 10.1 | ○ |
| Example 7 | C4 | Performed | φ300 | 0.7 | 77 | 3.2 | Inside | Inside | 430-433 | 431-446 | 446 | 35-41 | 11.8 | ○ |
| Example 8 | C5 | Performed | φ300 | 1.0 | 73.1 | 2.53 | Outside | Inside | 191-207 | 170-176 | 207 | 25-49 | 15.1 | ○ |
| Example 9 | C1 | Not performed | φ300 | 0.7 | 75.8 | 2.77 | Outside | Outside | 520-914 | 507-808 | 914 | 49-103 | 23.8 | x |
| Example 10 | C5 | Not performed | φ300 | 1.0 | 73.1 | 2.53 | Outside | Outside | 321-718 | 347-606 | 718 | 54-140 | 52.5 | x |

Example 1

In Example 1, the raw material was adjusted to cause the glass substrate to have predetermined composition C1, the raw material was melted, the melted raw material was stirred to manufacture an ingot of glass, and the ingot was machined to manufacture the glass substrate having the diameter, the thickness, the Young's modulus, the density, the position of the lowest point, and the deflection amount indicated by Table 1.

Example 2

In Example 2, the raw material was adjusted to cause the glass substrate to have the composition C1, the raw material was melted, the melted raw material was stirred to manufacture an ingot of glass, and the ingot was machined to manufacture the glass substrate having the diameter, the thickness, the Young's modulus, the density, the position of the lowest point, and the deflection amount indicated by Table 1.

Example 3

In Example 3, the raw material was adjusted to cause the glass substrate to have the composition C1, the raw material was melted, the melted raw material was stirred to manufacture an ingot of glass, and the ingot was machined to manufacture the glass substrate having the diameter, the thickness, the Young's modulus, the density, the position of the lowest point, and the deflection amount indicated by Table 1.

Example 4

In Example 4, the raw material was adjusted to cause the glass substrate to have the composition C1, the raw material was melted, the melted raw material was stirred to manufacture a plate-shaped glass substrate, and the glass substrate having the diameter, the thickness, the Young's modulus, the density, the position of the lowest point, and the deflection amount indicated by Table 1 was manufactured.

Example 5

In Example 5, the raw material was adjusted to cause the glass substrate to have predetermined composition C2, the raw material was melted, the melted raw material was stirred to manufacture a plate-shaped glass substrate, and the glass substrate having the diameter, the thickness, the Young's modulus, the density, the position of the lowest point, and the deflection amount indicated by Table 1 was manufactured.

Example 6

In Example 6, the raw material was adjusted to cause the glass substrate to have predetermined composition C3, the raw material was melted, the melted raw material was stirred to manufacture a plate-shaped glass substrate, and the glass substrate having the diameter, the thickness, the Young's modulus, the density, the position of the lowest point, and the deflection amount indicated by Table 1 was manufactured.

Example 7

In Example 7, the raw material was adjusted to cause the glass substrate to have predetermined composition C4, the raw material was melted, the melted raw material was stirred to manufacture a plate-shaped glass substrate, and the glass substrate having the diameter, the thickness, the Young's modulus, the density, the position of the lowest point, and the deflection amount indicated by Table 1 was manufactured.

Example 8

In Example 8, the raw material was adjusted to cause the glass substrate to have predetermined composition C5, the raw material was melted, the melted raw material was stirred to manufacture an ingot of glass, and the ingot was machined to manufacture the glass substrate having the diameter, the thickness, the Young's modulus, the density, the position of the lowest point, and the deflection amount indicated by Table 1.

Example 9

In Example 9, the raw material was adjusted to cause the glass substrate to have the composition C1, the raw material was melted to manufacture an ingot of glass without stirring the melted raw material, and the ingot was machined to manufacture the glass substrate having the diameter, the thickness, the Young's modulus, the density, the position of the lowest point, and the deflection amount indicated by Table 1.

Example 10

In Example 10, the raw material was adjusted to cause the glass substrate to have the composition C5, the raw material was melted to manufacture an ingot of glass without stirring the melted raw material, and the ingot was machined to manufacture the glass substrate having the diameter, the thickness, the Young's modulus, the density, the position of the lowest point, and the deflection amount indicated by Table 1.

The composition C1 to C5 falls within the following range in mass % on an oxide basis.

$SiO_2$: equal to or larger than 40 mass % and equal to or smaller than 75 mass %, $Al_2O_3$: equal to or larger than 0 mass % and equal to or smaller than 20 mass %, $B_2O_3$: equal to or larger than 0 mass % and equal to or smaller than 20 mass %, MgO: equal to or larger than 0 mass % and equal to or smaller than 25 mass %, CaO: equal to or larger than 0 mass % and equal to or smaller than 25 mass %, SrO: equal to or larger than 0 mass % and equal to or smaller than 10 mass %, BaO: equal to or larger than 0 mass % and equal to or smaller than 20 mass %, $Li_2O$: equal to or larger than 0 mass % and equal to or smaller than 40 mass %, $Na_2O$: equal to or larger than 0 mass % and equal to or smaller than 15 mass %, $K_2O$: equal to or larger than 0 mass % and equal to or smaller than 10 mass %, $ZrO_2$: equal to or larger than 0 mass % and equal to or smaller than 10 mass %, $TiO_2$: equal to or larger than 0 mass % and equal to or smaller than 5 mass %, and $Y_2O_3$: equal to or larger than 0 mass % and equal to or smaller than 10 mass %.

Content of Evaluation

Figure 5:
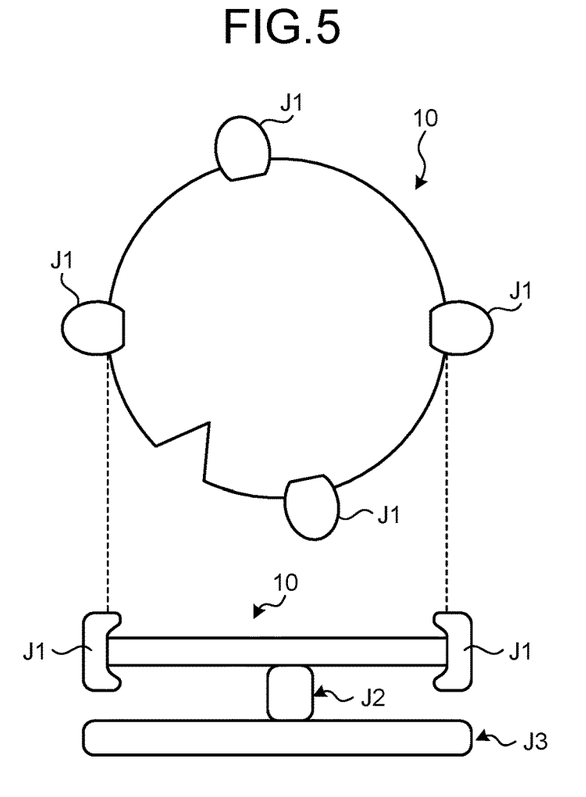
FIG. 5 is a diagram for explaining an evaluation method for each example.
Figure 6:
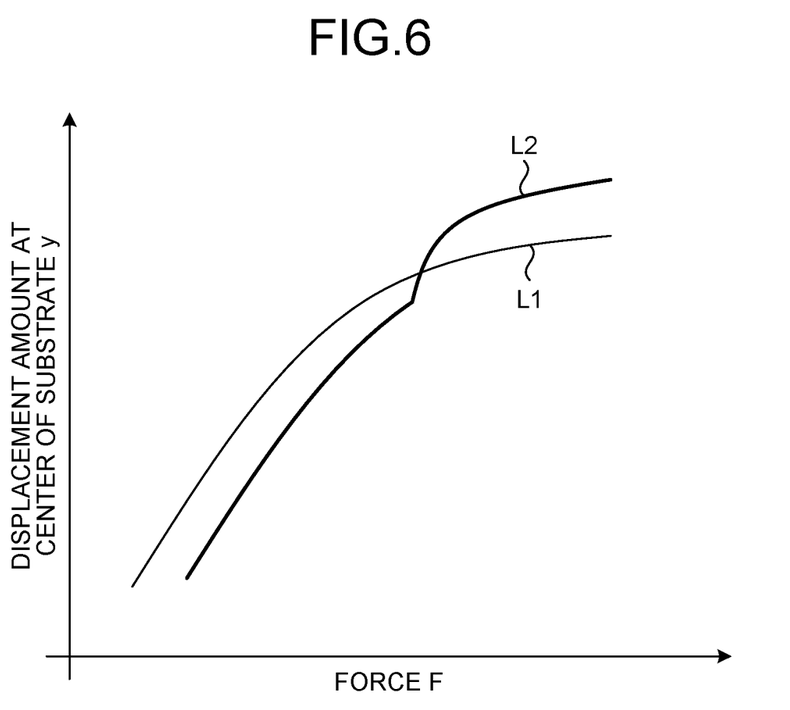
FIG. 6 is a graph indicating an example of dy/dF.

Evaluation was performed for samples of the respective examples manufactured as described above. FIG. 5 is a diagram for explaining an evaluation method for each example. In the evaluation, the outer circumference of the glass substrate was held by supporting members J1, a load was applied to a center part of the surface of the glass substrate while changing a value of the load, and displacement at the center part to which the load was applied was measured. Specifically, as illustrated in FIG. 5, an end face of the glass substrate was held by the four supporting members J1 at regular intervals in the circumferential direction. Force for fixing the glass substrate with the supporting members J1 was set to be as weak as possible so that the glass substrate is not shifted. A center part of a bottom surface of the glass substrate was arranged on a supporting member J2, and the glass substrate was arranged on a precision balance J3 together with the supporting member J2. A load was measured by the precision balance J3. The displacement herein is a deflection amount, and indicates a difference between a position of the center part and the highest point of the glass substrate in the Z-direction, for example. Assuming that the load applied to the center part is F and the displacement of the center part is y, a graph indicating a relation between F and y is created, and it is determined whether there is a point where a change of y with respect to a change of F is discontinuous, that is, whether there is a point where dy/dF is discontinuous. The glass substrate including a discontinuous point was rejected because a deflection shape of the entire system was discontinuously changed at the time of manufacturing a semiconductor and an anomaly occurs in the process, and the glass substrate not including a discontinuous point was accepted. FIG. 6 is a graph indicating an example of dy/dF. A line segment L1 in FIG. 6 indicates an example in a case in which there is no point where dy/dF is discontinuous, and a line segment L2 indicates an example in a case in which there is a point where dy/dF is discontinuous. However, the line segments L1 and L2 are merely examples, and do not indicate evaluation results of the respective examples described above.

Evaluation Results

Table 1 indicates evaluation results of the respective examples. As indicated by Table 1, it can be found that the evaluation result was "accepted" in Example 1 to Example 8 as the examples, and the evaluation result was "rejected" in Example 9 and Example 10 as comparative examples.

What is claimed is:

1. A glass substrate for manufacturing a semiconductor device, wherein, in a case in which one surface is directed downward in a vertical direction and a first position, a second position, and a third position on the one surface on an outer side in a radial direction with respect to a center point of the glass substrate are supported by supporting members, a lowest point as a position where a height in the vertical direction is the lowest on other surface is positioned in a circular central region on an inner side in the radial direction with respect to the first position, the second position, and the third position when viewed from the vertical direction, a center of the central region is a center point of the glass substrate, and a diameter of the central region has a length of ⅓ of a diameter of the glass substrate, wherein,
assuming that a larger value of maximum deflection amounts is Tmax, the maximum deflection amounts including a maximum deflection amount in a case in which the one surface is directed downward in the vertical direction and the first position, the second position, and the third position on the one surface are supported by the supporting members and a maximum deflection amount in a case in which the other surface is directed downward in the vertical direction and the first position, the second position, and the third position on the other surface are supported by the supporting members, a thickness of the glass substrate is D, and a Young's modulus of the glass substrate is E, $Tmax \cdot D^3 \cdot E/1000 \leq 20$ is satisfied.

2. A glass substrate for manufacturing a semiconductor device, wherein, in a case in which one surface is directed downward in a vertical direction and a first position, a second position, and a third position on the one surface on an outer side in a radial direction with respect to a center point of the glass substrate are supported by supporting members, a lowest point as a position where a height in the vertical direction is the lowest on other surface is positioned in a circular central region on an inner side in the radial direction with respect to the first position, the second position, and the third position when viewed from the vertical direction, a center of the central region is a center point of the glass substrate, and a diameter of the central region has a length of ⅓ of a diameter of the glass substrate, wherein,
a warpage amount excepting deflection due to self weight is equal to or smaller than 250 μm, and deviation of a thickness is equal to or smaller than 10 μm.

3. The glass substrate according to claim 1, wherein, in a case in which the other surface is directed downward in the vertical direction, and a first position, a second position, and a third position on the other surface on the outer side in the radial direction with respect to the center point of the glass substrate are supported by supporting members, the lowest point as a position where the height in the vertical direction is the lowest on the one surface is positioned in the central region when viewed from the vertical direction.

4. The glass substrate according to claim 1, wherein a thickness is equal to or smaller than 2 mm.

5. The glass substrate according to claim 4, wherein
a diameter is equal to or larger than 150 mm and equal to or smaller than 700 mm, and
a maximum deflection amount is equal to or smaller than 650 μm in a case in which the one surface is directed downward in the vertical direction, and the first position, the second position, and the third position on the one surface are supported by the supporting members.

6. The glass substrate according to claim 5, wherein the maximum deflection amount is equal to or smaller than 600 μm in a case in which the other surface is directed downward in the vertical direction, and the first position, the second position, and the third position on the other surface on the outer side in the radial direction with respect to the center point of the glass substrate are supported by the supporting members.

7. The glass substrate according to claim 1, wherein a warpage amount excepting deflection due to self weight is equal to or smaller than 250 μm, and deviation of a thickness is equal to or smaller than 10 μm.

8. The glass substrate according to claim 7, wherein a warpage amount excepting deflection due to self weight is equal to or smaller than 100 μm, and deviation of a thickness is equal to or smaller than 3 μm.

9. The glass substrate according to claim 1, containing, in mass % on an oxide basis:
$SiO_2$: equal to or larger than 40 mass % and equal to or smaller than 75 mass %;
$Al_2O_3$: equal to or larger than 0 mass % and equal to or smaller than 20 mass %;
$B_2O_3$: equal to or larger than 0 mass % and equal to or smaller than 20 mass %;

MgO: equal to or larger than 0 mass % and equal to or smaller than 25 mass %;
CaO: equal to or larger than 0 mass % and equal to or smaller than 25 mass %;
SrO: equal to or larger than 0 mass % and equal to or smaller than 10 mass %;
BaO: equal to or larger than 0 mass % and equal to or smaller than 20 mass %;
$Li_2O$: equal to or larger than 0 mass % and equal to or smaller than 40 mass %;
$Na_2O$: equal to or larger than 0 mass % and equal to or smaller than 15 mass %;
$K_2O$: equal to or larger than 0 mass % and equal to or smaller than 10 mass %;
$ZrO_2$: equal to or larger than 0 mass % and equal to or smaller than 10 mass %;
$TiO_2$: equal to or larger than 0 mass % and equal to or smaller than 5 mass %; and
$Y_2O_3$: equal to or larger than 0 mass % and equal to or smaller than 10 mass %.

10. The glass substrate according to claim 1, wherein the glass substrate is a glass substrate for manufacturing at least one of a Fan Out Wafer Level Package and a Fan Out Panel Level Package.

11. A method for manufacturing the glass substrate according to claim 1, the method comprising:
melting a raw material;
stirring the melted raw material under the condition that stirring is performed at a rotation speed equal to or higher than 5 rpm and equal to or lower than 20 rpm for a time equal to or longer than 12 hours and equal to or shorter than 24 hours; and
cooling the stirred raw material to form the glass substrate.

12. The glass substrate according to claim 2, wherein, in a case in which the other surface is directed downward in the vertical direction, and a first position, a second position, and a third position on the other surface on the outer side in the radial direction with respect to the center point of the glass substrate are supported by supporting members, the lowest point as a position where the height in the vertical direction is the lowest on the one surface is positioned in the central region when viewed from the vertical direction.

13. The glass substrate according to claim 2, wherein a thickness is equal to or smaller than 2 mm.

14. The glass substrate according to claim 13, wherein
a diameter is equal to or larger than 150 mm and equal to or smaller than 700 mm, and
a maximum deflection amount is equal to or smaller than 650 μm in a case in which the one surface is directed downward in the vertical direction, and the first position, the second position, and the third position on the one surface are supported by the supporting members.

15. The glass substrate according to claim 14, wherein the maximum deflection amount is equal to or smaller than 600 μm in a case in which the other surface is directed downward in the vertical direction, and the first position, the second position, and the third position on the other surface on the outer side in the radial direction with respect to the center point of the glass substrate are supported by the supporting members.

16. The glass substrate according to claim 2, wherein a warpage amount excepting deflection due to self weight is equal to or smaller than 100 μm, and deviation of a thickness is equal to or smaller than 3 μm.

17. The glass substrate according to claim 2, containing, in mass % on an oxide basis:
$SiO_2$: equal to or larger than 40 mass % and equal to or smaller than 75 mass %;
$Al_2O_3$: equal to or larger than 0 mass % and equal to or smaller than 20 mass %;
$B_2O_3$: equal to or larger than 0 mass % and equal to or smaller than 20 mass %;
MgO: equal to or larger than 0 mass % and equal to or smaller than 25 mass %;
CaO: equal to or larger than 0 mass % and equal to or smaller than 25 mass %;
SrO: equal to or larger than 0 mass % and equal to or smaller than 10 mass %;
BaO: equal to or larger than 0 mass % and equal to or smaller than 20 mass %;
$Li_2O$: equal to or larger than 0 mass % and equal to or smaller than 40 mass %;
$Na_2O$: equal to or larger than 0 mass % and equal to or smaller than 15 mass %;
$K_2O$: equal to or larger than 0 mass % and equal to or smaller than 10 mass %;
$ZrO_2$: equal to or larger than 0 mass % and equal to or smaller than 10 mass %;
$TiO_2$: equal to or larger than 0 mass % and equal to or smaller than 5 mass %; and
$Y_2O_3$: equal to or larger than 0 mass % and equal to or smaller than 10 mass %.

18. The glass substrate according to claim 2, wherein the glass substrate is a glass substrate for manufacturing at least one of a Fan Out Wafer Level Package and a Fan Out Panel Level Package.

19. A method for manufacturing the glass substrate according to claim 2, the method comprising:
melting a raw material;
stirring the melted raw material under the condition that stirring is performed at a rotation speed equal to or higher than 5 rpm and equal to or lower than 20 rpm for a time equal to or longer than 12 hours and equal to or shorter than 24 hours; and
cooling the stirred raw material to form the glass substrate.

* * * * *